United States Patent
Kim

(10) Patent No.: US 6,545,917 B2
(45) Date of Patent: Apr. 8, 2003

(54) CIRCUIT FOR CLAMPING WORD-LINE VOLTAGE

(75) Inventor: Dae Han Kim, Ichon-Shi (KR)

(73) Assignee: Hynix Semiconductor, Inc., Kyungki-do (KR)

( * ) Notice: Subject to any disclaimer, the term of this patent is extended or adjusted under 35 U.S.C. 154(b) by 0 days.

(21) Appl. No.: 10/006,112

(22) Filed: Dec. 10, 2001

(65) Prior Publication Data

US 2003/0002352 A1 Jan. 2, 2003

(30) Foreign Application Priority Data

Jun. 29, 2001 (KR) ........................................ 2001-38431

(51) Int. Cl.⁷ ............................................. G11C 7/00
(52) U.S. Cl. ........................... 365/189.08; 365/189.06; 365/189.07; 365/189.09; 365/189.11
(58) Field of Search .................. 365/189.06, 189.07, 365/189.08, 189.09, 189.11

(56) References Cited

U.S. PATENT DOCUMENTS

| | | | | |
|---|---|---|---|---|
| 4,752,699 A | * | 6/1988 | Cranford et al. ............ | 327/100 |
| 5,815,440 A | * | 9/1998 | Akaogi et al. ......... | 365/185.24 |
| 5,835,420 A | | 11/1998 | Lee et al. .............. | 3650/189.9 |
| 6,011,724 A | | 1/2000 | Brigati et al. .......... | 365/185.29 |
| 6,288,945 B1 | * | 9/2001 | Kawashima et al. ... | 365/185.23 |

FOREIGN PATENT DOCUMENTS

| | | |
|---|---|---|
| DE | 693 19 991 | 4/1994 |
| JP | 2000-195283 | 7/2000 |

* cited by examiner

*Primary Examiner*—David Nelms
*Assistant Examiner*—Ly Duy Pham
(74) *Attorney, Agent, or Firm*—Morgan, Lewis & Bockius LLP

(57) ABSTRACT

The present invention relates to a circuit for clamping a word line voltage. The circuit comprises a reference voltage generating means for generating a reference voltage depending on first and second signals; a bootstrap circuit for generating a pumping voltage of a higher potential than a target voltage depending on the first and second signals to an output terminal; a control signal generating means for generating the first and second control signals depending on the first~third signals; a clamping control means for falling the pumping voltage depending the first and second control signals to generate a compare voltage; a comparator for comparing the reference voltage and the compare voltage to generate a third signal; and a discharging means for discharging the potential of the output terminal depending on the third signal to fall the pumping voltage to a target voltage.

18 Claims, 4 Drawing Sheets

CIRCUIT FOR CLAMPING WORD-LINE VOLTAGE

BACKGROUND OF THE INVENTION

1. Field of the Invention

The invention relates generally to a circuit for clamping a word line voltage. More particularly to The invention relates is concerned with a circuit for clamping a word line voltage for use in devices driven by a high voltage and flash memory cells, which can generate a pumping voltage of a stable potential even in variations in the power supply voltage in the process of pumping the power supply voltage.

2. Description of the Prior Art

Generally speaking, flash memory cells or specific devices are driven by higher voltage than a general power supply voltage. This higher voltage is generated by a pumping circuit and is controlled by a clamping circuit so that it can maintain a constant potential.

Referring now to FIG. 1, an operation of a conventional word line voltage clamping circuit will be below described.

As shown in FIG. 1, the conventional word line voltage clamping circuit includes a pumping signal generating means 110 for generating a pumping signal KICK to a pumping node Q11 according to a first external signal CE; a pre-charging means 120 for pre-charging an output terminal; a first switching means N11 for discharging the pumping node according to a second external signal ATD; a boosting capacitor Cb connected between the pumping node and the output terminal, which increases the potential of the output terminal by a coupling effect of a capacitor to generate the boosting voltage Vboot if the pumping signal KICK is applied; a reference voltage generating means 130 for generating a reference voltage according to the first external signal CE); and a clamping means 140 for comparing the reference voltage and the potential of the pumping node to adjust the potential of the pumping node.

The pumping signal generating means 110 includes an inverter I11 for inverting the first external signal CE, a second switching means P11 for switching the power supply voltage VDD according to the output signal of the inverter I11, and first and second resistors R11 and R12 for dividing the power supply voltage VDD into given voltages, wherein the divided voltages are outputted to the pumping node Q11 as the pumping signal KICK.

The clamping means 140 includes a comparator 141 for comparing the reference voltage and the potential of the pumping node, a third switching means P12 for switching the power supply voltage VDD to the pumping node Q11 according to the output signal of the comparator 141, and a fourth switching means P13 for switching the power supply voltage VDD to the pumping node Q11 depending on an output signal of an Exclusive NOR gate I12 and Exclusive NOR gate I12 using the output signal of the comparator 141 and the second external signal ATD as an input signal. At this time, the driving capability of the fourth switching means P13 is higher than that of the third switching means P12.

In the above, the pumping signal generating means 110, the pre-charging means 120 and the boosting capacitor Cb correspond to a basic construction of the bootstrap circuit which pumps the power supply voltage to produce a high voltage. In order to drive the bootstrap circuit, they receive a chip enable signal and an address transition detection signal. The first external signal CE corresponds to the chip enable signal and the second external signal ATD corresponds to the address transition detection signal ATD. If the first external signal CE is applied, the address signal input is allowed and the second external signal ATD is started to generate.

First, if the first external signal CE is initially applied while the pumping node Q11 maintains a discharging state by the first switching means N11, the discharging state is stopped, the pumping signal KICK is generated in the pumping signal generating means 110 and is then applied to the pumping node Q11, and the reference voltage Vref is then generated in the reference voltage generating means 130. At this time, the pumping signal KICK generated by the pumping signal generating means 110 is lower than a target voltage, applied to the pumping node Q11 and clamped to the target voltage by the clamping means 140.

The comparator 141 in the clamping means 140 compares the reference voltage Vref and the potential of the pumping signal KICK of the pumping node Q11 determine the amount that will be additionally charged to the pumping signal KICK.

In case that the pumping node Q11 must be charged with a small amount of the power supply voltage VDD by applying a high power supply voltage VDD, the comparator 141 generates an output signal of a LOW level to make the third switching means P12 having a low driving capacity an on state. Thus, the pumping node Q11 can be additionally charged with the power supply voltage VDD, so that the potential of the pumping node Q11 can reach the target potential. At this time, the Exclusive NOR gate I12 generates a signal of a HIGH level depending on the output signal of the comparator 141 and the output signal of the pumping node Q11, thus making the fourth switching means P13 an off state.

On the contrary, in case that the pumping node Q11 must be charged with a large amount of the power supply voltage VDD by applying a low power supply voltage VDD, the comparator 141 generates an output signal of a HIGH level to make the third switching means P12. Also, the Exclusive NOR gate I12 generates a signal of a LOW level depending on the output signal of the comparator 141 and the potential of the pumping node Q11, so that the fourth switching means P13 having a high driving capacity has an off state. Therefore, the pumping node Q11 can be additionally charged with a large amount of the power supply voltage VDD so that the potential of the pumping node Q11 can reach the target potential.

Therefore, the clamping means 140 adequately discharges the pumping node Q11 with the power supply voltage VDD through the third or fourth switching means P12 or P13 to generate the pumping signal KICK having the potential of a certain degree that can generate a target boosting voltage Vboot.

In order to generate a constant boosting voltage Vboot even variations in the power supply voltage VDD, this type of the word line voltage clamping circuit must have the comparator 141 being the power supply voltage detection means. In case of the power supply voltage VDD, though the power supply voltage supplier outside a chip supplies a stable power supply voltage VDD, the power supply voltage VDD within the chip is influenced by a bouncing effect due to the power consumption. In particular, loading in order to obtain the boosting voltage Vboot from the output terminal, the timing when detection is made is one that has to drive the boosting capacitor the pumping signal KICK of which has a great. Thus, this timing is sensitive to noise since a lot of power is consumed. Therefore, there is a disadvantage that the power supply voltage VDD detection method is weak to the noise. Also, as detection of the power supply begins after the second external signal ATD is changed from the HIGH level to the LOW level, there is a problem that the operating speed of the device is lowered.

In view of the power consumption of the word line voltage clamping circuit, there is a problem that the power consumption is increased since a current path is always formed.

In the operation of initially discharging the pumping node Q11, there is formed a current path to the second resistor R12 and the switching means N11 through the switching means P11 and the first resistor R11. Thus, there is generated a power consumption.

In the operation of additionally charging the pumping node Q11 with a given power supply voltage in order to generate the boosting voltage Vboot, there is formed a current path to the second resistor R12 of the pumping signal generating means 110 through the third or forth switching means P12 or P13. Thus, there is generated a power consumption.

SUMMARY OF THE INVENTION

It is therefore an object of the present invention to provide a circuit for claming a word line voltage capable of minimizing the power consumption and improving the operating speed, in a way that the voltage applied to a triple p-well being a body of a transistor for a voltage fall means is controlled to facilitate a DC operation bias setting, that is, a clamping voltage setting, the clamping operation is performed only when the pumped voltage is higher than a target voltage, and a current path is shielded using the switching means after the clamping operation is finished.

In order to accomplish the above object, a circuit for claming a word line voltage according to the present invention is characterized in that it comprises a reference voltage generating means for generating a reference voltage depending on first and second signals; a bootstrap circuit for generating a pumping voltage of a higher potential than a target voltage depending on the first and second signals to an output terminal; a control signal generating means for generating the first and second control signals depending on the first through third signals; a clamping control means for falling the pumping voltage depending on the first and second control signals to generate a compare voltage; a comparator for comparing the reference voltage and the compare voltage to generate a third signal; and a discharging means for discharging the potential of the output terminal depending on the third signal to fall the pumping voltage to a target voltage.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
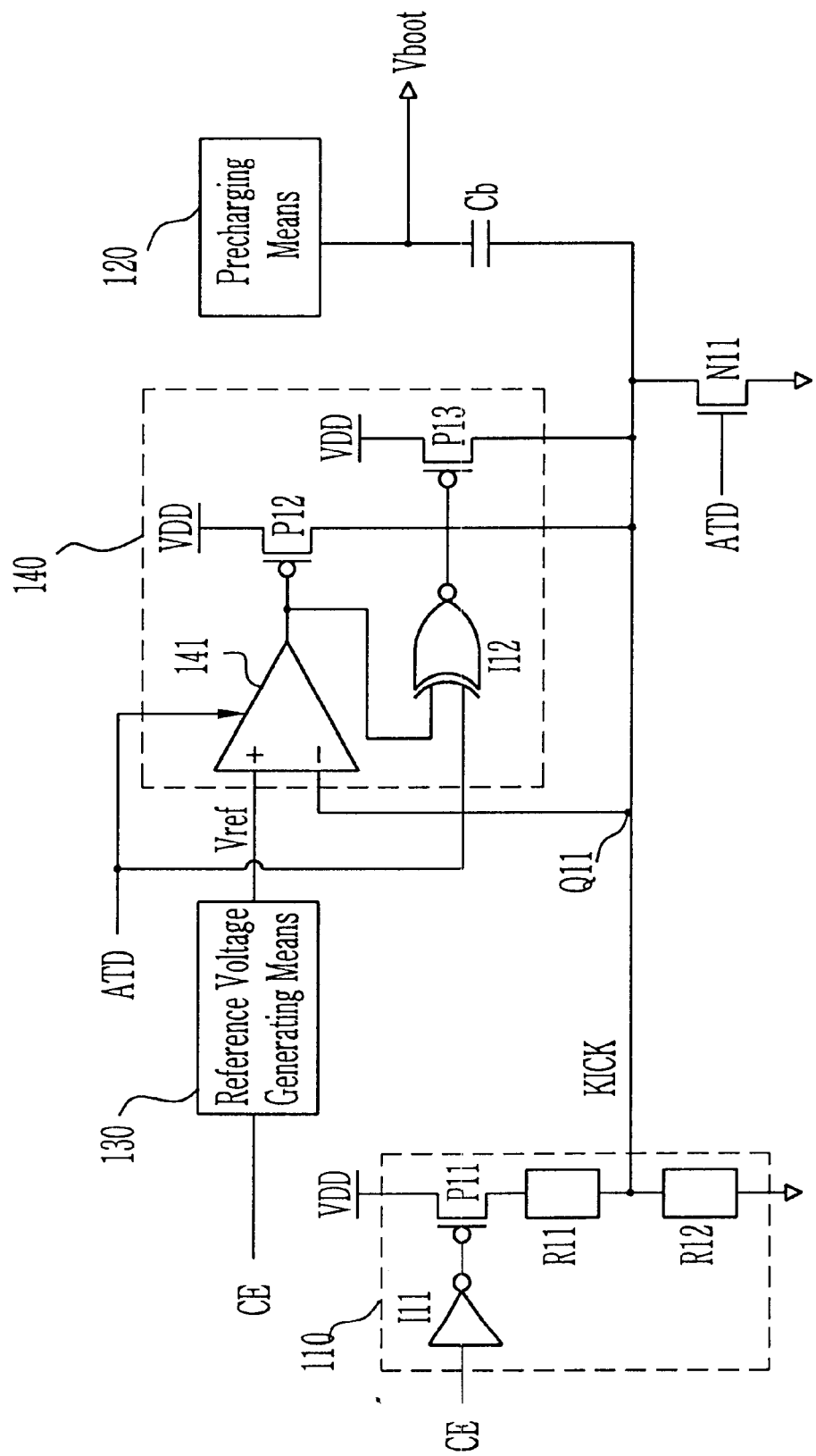
FIG. 1 is a circuit diagram of a conventional word line voltage clamping circuit.

The present invention will be described in detail by way of a preferred embodiment with reference to accompanying drawings, in which like reference numerals are used to identify the same or similar parts.

Figure 2:
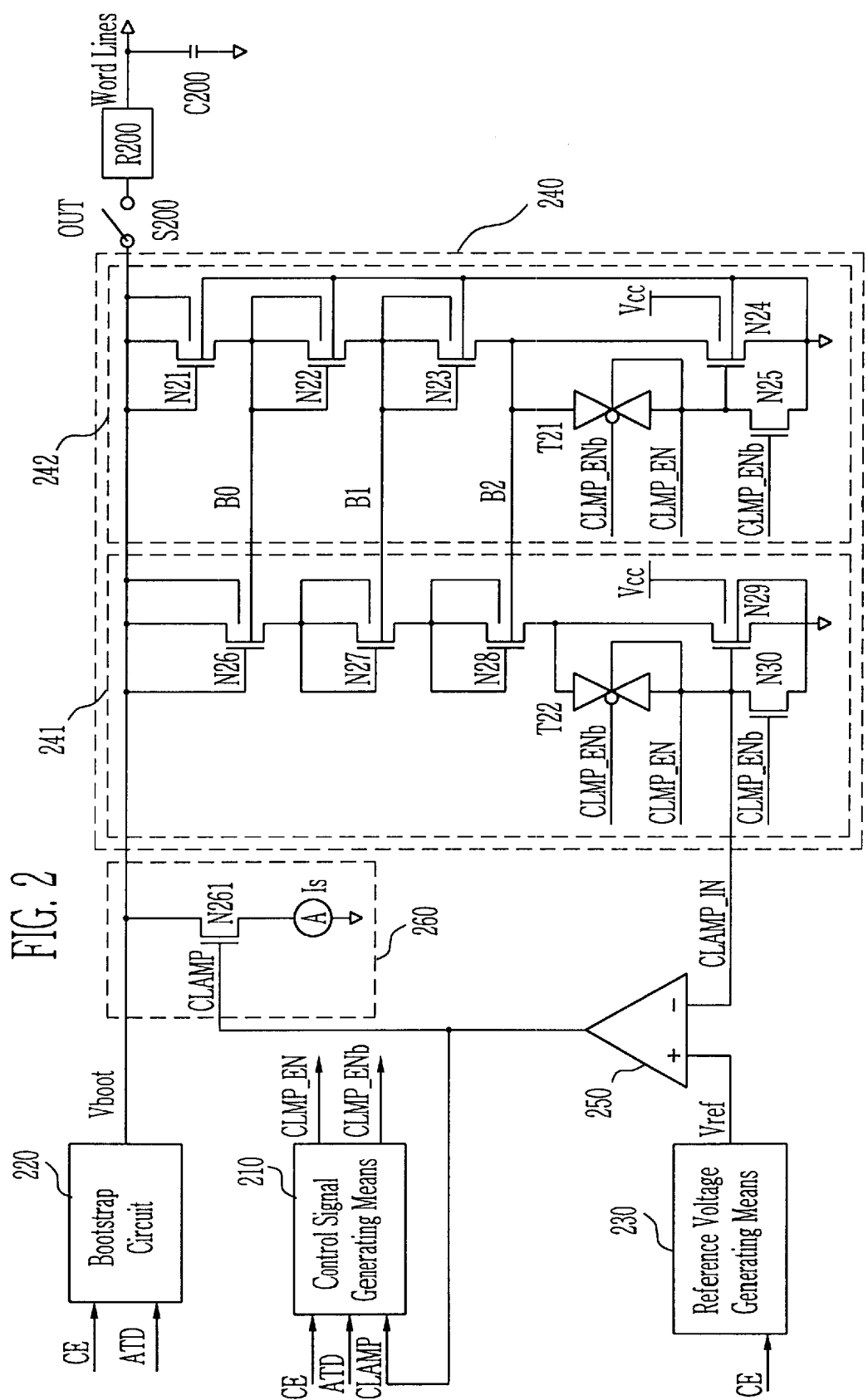
FIG. 2 is a circuit diagram of a word line voltage clamping circuit according to the present invention.
Figure 3:
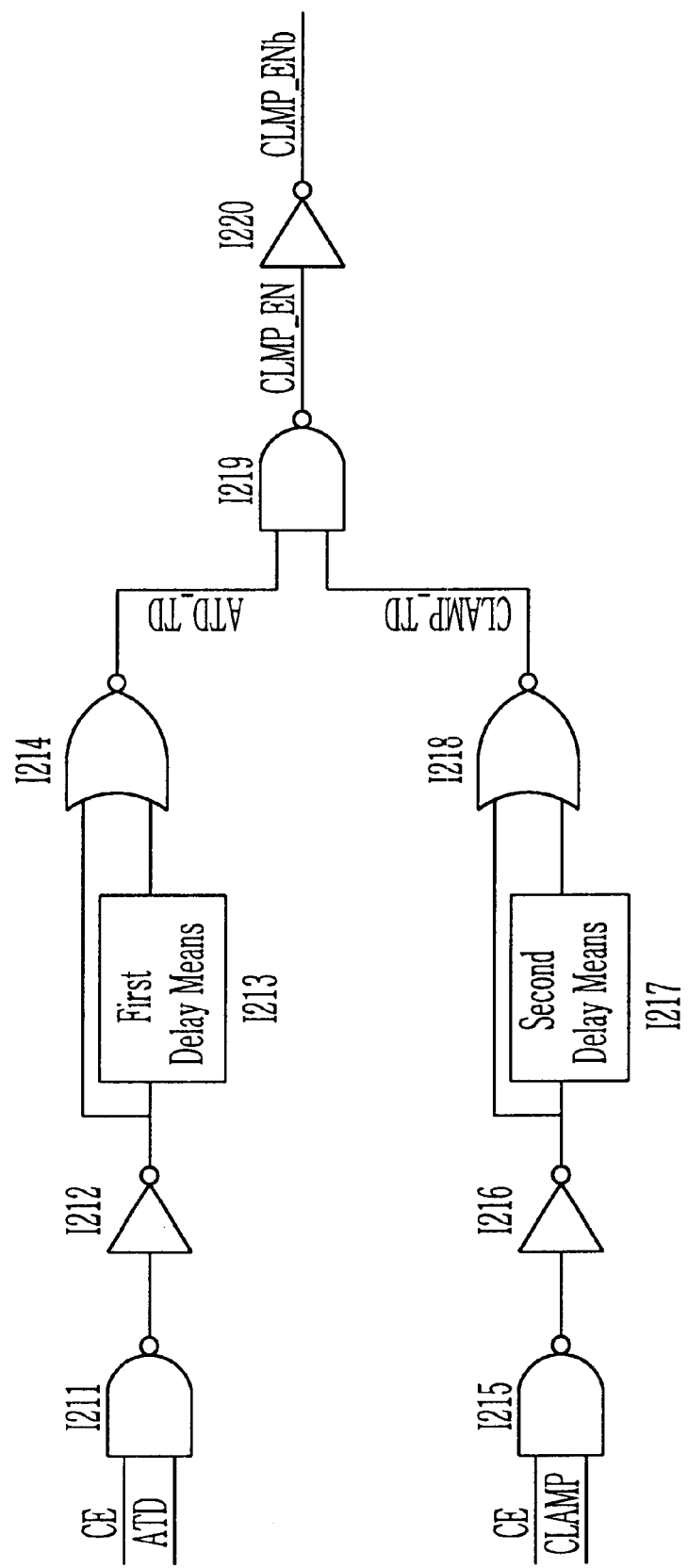
FIG. 3 is a circuit diagram of explaining an operation of a control signal generating means shown in FIG. 2.
Figure 4:
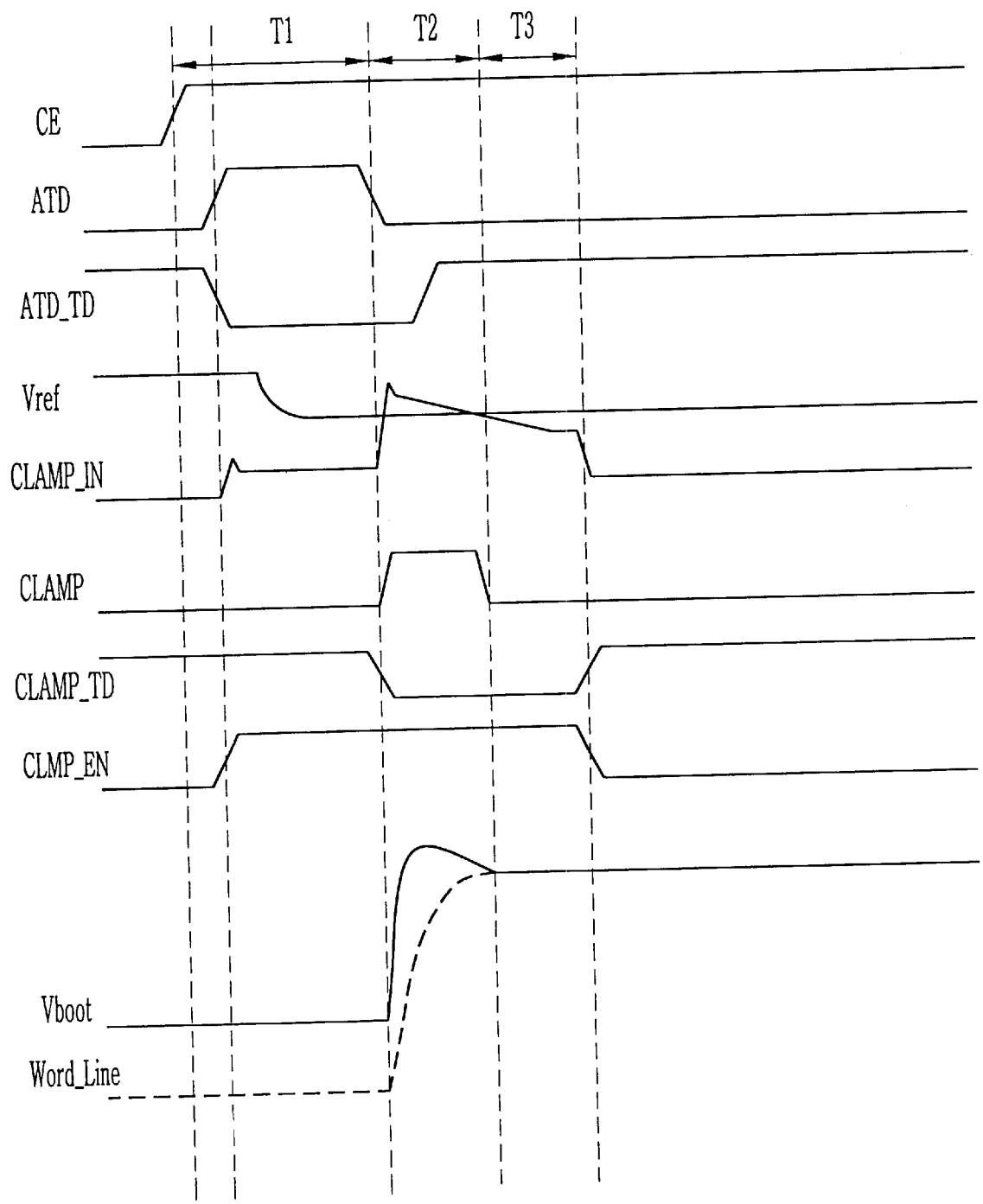
FIG. 4 is a characteristic graph illustrating the waveform and the input signal of a specific node in FIGS. 2 and 3.

FIG. 2 is a circuit diagram of a word line voltage clamping circuit according to the present invention, FIG. 3 is a circuit diagram of explaining an operation of a control signal generating means shown in FIG. 2, and FIG. 4 is a characteristic graph illustrating the waveform and the input signal of a specific node in FIGS. 2 and 3.

As shown in FIG. 2, the word line clamping circuit includes a control signal generating means 210 for generating first and second control signals CLMP_EN and CLMP_ENb depending on first~third signals CE, ATD and CLAMP; a bootstrap circuit 220 for generating a pumping voltage Vboot to an output terminal OUT depending on first and second signals CE and ATD; a reference voltage generating means 230 for generating a reference voltage depending on the first signal CE; a clamping control means 240 for sensing the pumping voltage Vboot to generate a compare voltage CLAMP_IN being a clamping enable signal depending on the first and second control signals CLMP_EN and CLMP_ENb; a comparator 250 for comparing the reference voltage Vref and the compare voltage CLAMP_IN to generate a third signal CLAMP); and a discharging means 260 for discharging the potential of the pumping voltage Vboot by a given potential depending on the third signal CLAMP.

The control signal generating means 210 includes a first NAND gate I211 for receiving the first and second signals CE and ATD as an input; a first inverter I212 for inverting an output signal of the first NAND gate I211; a first delay means I213 for delaying an output signal of the first inverter I212; a first NOR gate I214 for receiving output signals of the first inverter I212 and the first delay means I213; a second NAND gate I215 for receiving the first and third signals CE and CLAMP as an input; a second inverter I216 for inverting an output signal of the second NAND gate I215; a second delay means I217 for delaying an output of the second inverter I216; a second NOR gate I218 for receiving output signals of the second inverter I216 and the second delay means I217; a third NAND gate I219 for receiving output signals of the first and second NOR gate I214 and I218 to produce the first control signal CLMP_EN; and a third inverter I220 for inverting an output signal of the third NAND gate I219 to produce the second control signal CLMP_ENb.

The clamping control means 240 consists of a main clamping control means 241 and a sub-clamping control means 242.

The sub clamping control means 242 has a diode connection structure in which a drain terminal and a gate terminal are connected. The sub clamping control means 242 includes a first transistor N21 connected between an output terminal OUT and a first node B0 to generate a first voltage to the first node B0; a second transistor N22 connected between the first node B0 and the second node B1 to generate a second voltage to a second node B1; a third transistor N23 connected between the second node B1 and the third node B2 to generate a third voltage to the third node B2; a fourth transistor N24 connected between a source terminal of the third transistor N23 and a ground terminal; a first transfer gate T21 for connecting a source terminal of the third transistor N23 and a gate terminal of the fourth transistor N24 depending on the first and second control signals CLMP_EN and CLMP_ENb; and a fifth transistor N25 for connecting the gate terminal of the fourth transistor N24 and the ground terminal depending on the second control signal CLMP_ENb. The first through fourth transistors N21 through N24 are formed in a triple well structure. The triple p-well corresponding to a body is connected to the ground terminal. The triple n-wells of the first through third transistors N21 through N23 are connected to respective drain terminals. To a triple n-well of the fourth transistor N24 is applied the power supply voltage. The threshold voltage of the fourth transistor N24 is higher than those of the first through third transistors N21 through N23.

The main clamping control means 241 has a diode connection structure in which a drain terminal and a gate terminal are connected and is also serially connected to the output terminal OUT. The main clamping control means 241 includes sixth through eighth transistors N26 through N28 used as a voltage fall means, a ninth transistor N29 connected between a source terminal of the eighth transistor N28 and the ground terminal, a second transfer gate T22 for connecting a source terminal of the eighth transistor N28 and a gate terminal of the ninth transistor N29 depending on the first and second control signals CLMP_EN and CLMP_ENb, and a tenth transistor N30 for connecting a gate terminal of the ninth transistor N29 and the ground terminal depending on the second control signal CLMP_ENb. The sixth through ninth transistors N26 through N29 are formed in a triple well structure. The triple p-well of the sixth transistor N26 is supplied with the potential of the first node B0 to which the first and second transistors N21 and N22 are connected. The triple n-well is connected to the drain terminal. The triple p-well of the seventh transistor N27 is supplied with the potential of the second node B1 to which the second and third transistors N22 and N23 are connected. The triple n-well is connected to the drain terminal. A triple p-well of the eighth transistor N28 is supplied with the potential of the third node B2 to which the third and fourth transistors N23 and N24 are connected and a triple n-well is connected to the drain terminal. The triple p-well of the ninth transistor N29 is connected to the ground terminal and the power supply voltage is applied to the triple n-well. The threshold voltage of the ninth transistor N29 is lower than those of the sixth through eighth transistors N26 through N28.

The discharging means 260 is connected to the output terminal OUT. The discharging means 260 includes a current source Is for discharging the potentials of the switching means N261 switched depending on the output signal and the output terminal OUT.

An operation of the word line clamping circuit constructed as above will be below described.

As shown in FIG. 3 and FIG. 4, if the first and second signals CE and ATD of a HIGH level are applied in the first period T1 being an initialization step, the bootstrap circuit 220 pumps the power supply voltage to generate the pumping voltage Vboot. Also, the reference voltage generating means 230 generates the reference voltage Vref depending on the first signal CE to apply it to the first input terminal of the comparator 250. The control signal generating means 210 generates the first and second control signals CLMP_EN and CLMP_ENb depending on the first through third signals CE, ATD and CLAMP. The third signal CLAMP initially applies a LOW level as an output signal of the comparator 250. The discharging means 260 does not operate depending on the third signal CLAMP being an initial output signal of the comparator 250.

An operation by which the first and second control signals CLMP_EN and CLMP_ENb are generated from the control signal generating means 210 will be described as follows.

If the first and second signals CE and ATD of a HIGH level is inputted to the first NAND gate I211, the first NAND gate I211 generates a LOW signal, which is then inverted by the first inverter I212. To the first input terminal of the first NOR gate I214 is applied a signal of a HIGH level inverted by the first inverter I212, and to the second input terminal is applied a signal of a HIGH level inverted by the first inverter I212 via the first delay means I213, so that the first NOR gate I214 generates a signal of a LOW level. This LOW level signal is applied to the first input terminal of the third NAND gate I219. Then, third NAND gate I219 generates the first control signal CLMP_EN of a HIGH level with no regard to the signal applied to the second input terminal. The third inverter I220 inverts the first control signal CLMP_EN of a HIGH level to generate the second control signal CLMP_ENb of a LOW level. At this time, the width of the pulse generated by the first NOR gate I214 is increased by delaying the second signal ATD using the first delay means I213, which is for overlapping with the third signal CLAMP. The width of the pulse generated by the second NOR gate I218 is increased by delaying the third signal CLAMP using the second delay means I217, which generates the first control signal CLMP_EN with more longer and stable pulse to stabilize the compare voltage CLAMP_IN during the clamping.

The first and second control signals CLMP_EN and CLMP_ENb are applied to the first and second transfer gates T21 and T22 of the clamping control means 240. Depending on the first and second control signals CLMP_EN and CLMP_ENb, the gate and drain terminals of the fourth transistor N24 are connected to the first transfer gate T21 to enable the sub clamping control means 242 and the gate and drain terminals of the eighth transistor N28 are connected to the second transfer gate T22 to enable the main clamping control means 241. At this time, the voltage of each of the nodes B0 through B2 generated in the sub clamping control means 242 is applied to the triple p-well of the sixth through eighth transistors N26 through N28 for voltage fall, that is included in the main clamping control means 241 to adjust the threshold voltage.

Explaining in more detail, the reference voltage Vref generated by the reference voltage generating means 210 is fallen by the threshold voltage by means of the first transistor N21 of the sub clamping control means 242. The fallen potential of the first node B0 is then applied to the triple p-well of the sixth transistor N26 in the main clamping control means 241. The triple n-well of the sixth transistor N26 is connected to the drain terminal and is supplied with the potential of the drain terminal. The potential of the first node B0 is fallen by the threshold voltage by means of the second transistor N22. The fallen potential of the second node B1 is then applied to the triple p-well of the seventh transistor N27 in the main clamping control means 241. The triple n-well of the seventh transistor N27 is connected to the drain terminal and is supplied with the potential of the drain terminal. In addition, the potential of the second node B1 is fallen by the threshold voltage by means of the third transistor N23. The fallen potential of the third node B2 is then applied to the triple p-well of the eighth transistor N28 in the main clamping control means 241. The triple n-well of the eighth transistor N28 is applied to the drain terminal and is supplied with the potential of drain terminal. The potentials of each of the node B0 through B2 generated in the sub clamping control means 242 are applied to the triple p-wells of the sixth through eighth transistors N26 through N28 in the main clamping control means 241 so that the threshold voltages of the sixth through eighth transistors N26 through N28 can be adjusted.

The main clamping control means 241 falls the pumping voltage Vboot by a given voltage through the transistor N26~N28 for voltage fall, which are serially connected to the main clamping control means 241. The main clamping control means 241 also applies a compare voltage CLAMP_IN to the second input terminal of the comparator 250 through the first transfer gate T21.

In the second period T2, the comparator 250 compares the compare voltage CLAMP_IN generated in the clamping control means 240 with the reference voltage Vref generated in the reference voltage generating means 230. As the bootstrap circuit 220 generates the pumping voltage Vboot higher than the target voltage, a compare voltage CLAMP_IN of a high potential is generated. Therefore, as the compare voltage CLAMP_IN is higher than the reference voltage Vref, the comparator 250 generates the third signal CLAMP of a HIGH level to drive the discharging means 260.

The third signal CLAMP generated in the comparator 250 turns on the switching means N261 of the discharging means 260 and connects the output terminal OUT of the word line clamping circuit with the current source Is to discharge the pumping voltage Vboot of the output terminal OUT.

As the pumping voltage Vboot is discharged, the pumping voltage Vboot is lowered to the target voltage. Thus, the compare voltage CLAMP_IN is lowered to the reference voltage Vref.

In the third period T3, if the compare voltage CLAMP_IN is lowered than the reference voltage Vref since the pumping voltage Vboot is discharged by the discharging means 260, the comparator 250 generates the third signal CLAMP of a LOW level to turn off the switching means N261 of the discharging means 260.

At this time, the control signal generating means 210 generates the first control signal CLMP_EN with a LOW level and generates the second control signal CLMP_ENb with a HIGH level, while the third signal CLAMP is changed from a HIGH level to a LOW level.

An operation by which the first and second control signals CLMP_EN and CLMP_ENb are generated in the control signal generating means 210 will be described as follows.

If the first signal CE of a HIGH level and the second signal ATD of a LOW level are applied to the first NAND gate I211, the first NAND gate I211 generates the signal of a HIGH signal which is then inverted by the first inverter I212. To the first input terminal of the first NOR gate I214 is applied the signal of a LOW level inverted by the first inverter I212 and to the second input terminal is applied the signal of a LOW level inverted by the first inverter I212 via the delay means I213, thus producing the signal of a HIGH level. The second NAND gate I215 are supplied with the first signal CE of a HIGH level and the third signal CLAMP of a LOW level to produce the signal of a HIGH level which is then inverted by the second inverter I216. To the first input terminal of the second NOR gate I218 is applied the signal of a LOW level inverted by the second inverter I216 and to its second input terminal is applied the signal of a LOW level inverted by the second inverter I216 via the second delay means I217, thus producing a signal of a HIGH level. The signals of a HIGH level generated in the first and second NOR gates I214 and I218 are applied to the first and second input terminals of the third NAND gate I219 to produce the first control signal CLMP_EN of a LOW level. The third inverter I220 inverts the first control signal CLMP_EN of a LOW level to generate the second control signal CLMP_ENb of a HIGH level.

The first and second transfer gates T21 and T22 of the clamping control means 240 are turned off depending on the first and second control signals CLMP_EN and CLMP_ENb. Thereby, the clamping control means 240 does not operate. Also, as the fifth and tenth transistors N25 and N30 are turned on depending on the second control signal CLMP_ENb, the ground voltage is applied to the gate terminal of the fourth and eighth transistor N24 and N28. Thereby, the fourth and eighth transistors N24 and N28 are turned off and a current path from the output terminal OUT of the word line clamping circuit to the ground terminal is thus shielded. The tenth transistor N30, that is turned on by the second control signal CLMP_ENb, connects the second input terminal of the comparator 250 to the ground terminal to stop an operation of the comparator 250.

As the operation of the comparator 250 is stopped and the switching means N261 is turned off by the third signal CLAMP, the operation of the discharging means 260 is stopped and the discharging operation of the pumping voltage Vboot adjusted to the target voltage is also stopped so that the target voltage can be maintained.

Thereafter, if the switching means S200 connecting the output terminal OUT of the word line clamping circuit and the word line terminal is made to be on, the pumping voltage Vboot adjusted to be the target voltage is applied to the word lines via the load resistor R200 and the load capacitor C200.

In the above operation, the DC bias setting of the main clamping control means 241 can be freed by applying the potentials of each of the node B0 through B2 in the sub clamping control means 242 to the triple p-wells of the transistors N26 through N28 in the main clamping control means 241. That is, what the body voltage of each of the triple nMOS transistors is to control the threshold voltage by a body effect of each of the triple nMOS transistors. It is thus possible to control more easily and exactly the pumping voltage Vboot of the bootstrap circuit by adjusting the bias of the sub clamping control means 242. As this is directly concerned with adjustment of the word line voltage, it means that adjustment of the word line clamping voltage level is flexible. Also, using the potential of the first through third nodes B0 through B2 generated by the sub clamping control means 242. It becomes insensitive to lot-to-lot and wafer-to-wafer variations of each of the triple nMOS transistors by biasing the triple p-well being a body of the triple nMOS transistors N26 through N28 of the main clamping control means 241.

In particular, the word line clamping circuit performs the clamping operation only when the pumping voltage Vboot generated in the bootstrap circuit 220 reaches the target voltage. After the clamping operation, all the current paths of the clamping control means 240 are stopped to minimize the power consumption.

In case of the second signal ATD, as shown in FIG. 4, it may be a little longer than the pulse width inputted by the first delay means I213 of the control signal generating means 210. This is for overlapping with the third signal CLAMP. In addition, in case of the third signal CLAMP, it may be longer than the pulse width initially generated by the second delay means I218 of the control signal generating means 210. This is totally to stabilize the signal.

As can be understood from the above description, the present invention clamps the pumping voltage to a target voltage without detecting the power supply voltage. Therefore, the present invention can make the pumping voltage be insensitive to noises and after the clamping, can minimize the power consumption by precluding the current path. Also, the present invention can improve the speed without loss of a waiting time for performing the clamping and timing loss. Further, the present invention adjusts a body bias of the transistor for falling the voltage to allow easy clamping voltage setting and makes the clamping voltage be insensitive to lot-to-lot and wafer-to-wafer variations.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed are:

1. A circuit for clamping a word line voltage, comprising:
    a reference voltage generating means for generating a reference voltage depending on a first signal;
    a bootstrap circuit for generating a pumping voltage of a potential higher than a target voltage depending on the first signal and a second signal to an output terminal;
    a control signal generating means for generating first and second control signals depending on the first signal, the second signal, and a third signal;
    a clamping control means for sensing the pumping voltage depending on the first and second control signals to generate a compare voltage;
    a comparator for comparing the reference voltage and the compare voltage to generate the third signal; and
    a discharging means for discharging the potential of the output terminal depending on the third signal to discharge the pumping voltage to the target voltage.

2. The circuit according to claim 1, wherein the discharging means includes a switching means connected to the output terminal and switched depending on an output signal of the comparator, and a current source connected to the switching means and a ground terminal for generating a current to the ground terminal to discharge the potential of the output terminal.

3. The circuit according to claim 1, wherein the control signal generating means includes:
    a first NAND gate for receiving the first and second signals as an input;
    a first inverter for inverting an output signal of the first NAND gate;
    a first delay means for delaying an output signal of the first inverter;
    a first NOR gate for receiving the output signal of the first inverter and an output of the first delay means;
    a second NAND gate for receiving the first and third signals as an input;
    a second inverter for inverting an output signal of the second NAND gate;
    a second delay means for delaying an output signal of said second inverter;
    a second NOR gate for receiving the output signal of the second inverter and an output signal of the second delay means;
    a third NAND gate for receiving output signals of the first and second NOR gates to generate the first control signal; and
    a third inverter for inverting an output signal of the third NAND gate to generate the fourth control signal.

4. The circuit according to claim 1, wherein the clamping control means includes:
    a sub-clamping control means for discharging the pumping voltage depending on the first and second control signals to generate first, second, and third voltages; and
    a main clamping control means for discharging the pumping voltage depending on the first and second control signals to generate the compare voltage,
    wherein the main clamping control means controls the compare voltage by controlling a threshold voltage of a transistor for voltage discharge in a triple p-well that receives the first, second, and third voltages.

5. The circuit according to claim 4, wherein the sub-clamping control means includes:
    a first transistor drain and gate terminals connected to the output terminal, for discharging the pumping voltage to generate the first voltage;
    a second transistor drain and gate terminals connected to the source terminal of the first transistor for discharging the first voltage to generate the second voltage;
    a third transistor drain and gate terminals connected to the source terminal of the second transistor, for discharging the second voltage to generate the third voltage;
    a fourth transistor connected between the third transistor and the ground terminal;
    a first transfer for connecting the drain and gate terminal of the fourth transistor depending on the first and second control signals; and
    a fifth transistor for connecting a gate terminal of the fourth transistor and the ground terminal.

6. The circuit according to claim 5, wherein the first to fourth transistors include a triple nMOS transistor, wherein a triple p-well is connected to the ground terminal, triple n-wells of the first to third transistors are connected to the drain terminal, and a power supply voltage is applied to a triple n-well of the fourth transistor.

7. The circuit according to claim 5, wherein a threshold voltage of the first to third transistors is lower than a threshold voltage of the fourth transistor.

8. The circuit according to claim 4, wherein the main clamping control means includes:
    sixth to eighth transistors serially connected to the output terminal and to triple p-wells having applied the first to third voltages, wherein a gate terminal and a triple n-well of the sixth to eighth transistors are connected to drain terminals;
    a ninth transistor connected between the eighth transistor and the ground terminal and to a triple n-well having applied the power supply voltage, wherein a triple p-well of the ninth transistor is connected to the ground terminal;
    a second transfer gate connecting the drain and gate terminals of the ninth transistor depending on the first and second control signals, for transferring the discharged voltage by the sixth to eighth transistor to the output terminal as a compare voltage; and
    a tenth transistor for connecting the gate terminal of the ninth transistor and the ground terminal depending on the second control signal.

9. The circuit according to claim 8, wherein a threshold voltage of the fifth to eighth transistors is higher than a threshold voltage of the ninth transistor.

10. A circuit for clamping a word line voltage for comparing a compare voltage that is a result of a pumping voltage of a high potential discharged to a given potential with a reference voltage and discharging the pumping voltage of an output terminal to generate a word line voltage of a target potential, to control a clamping level of the word line voltage being characterized in that:

the pumping voltage is discharged to generate first to third voltages, using a plurality of transistors serially connected to the output terminal, a gate terminal and triple n-well connected to a drain terminal and a triple p-well connected to a ground terminal;

the first to third voltages are applied to a triple p-well of each of the transistors serially connected to the output terminal, and a gate terminal and a triple n-well connected to a drain terminal to discharge the pumping voltage with an adjusted threshold voltage to generate a compare voltage.

11. A circuit for clamping a word line voltage, comprising:

a reference voltage generating means for generating a reference voltage depending on a first signal;

a bootstrap circuit for generating a potential of a pumping voltage higher than a potential of a target voltage, depending on the first signal and a second signal to an output terminal;

a control signal generating means for generating first and second control signals, depending on the first signal, the second signal, and a third signal;

a clamping control means including a sub-clamping control means and a main clamping control means, the sub-clamping control means discharging the pumping voltage to generate first to third voltages depending on the first and second control signals, and the main clamping control means discharging the pumping voltage to generate a compare voltage depending on the first and second control signals, wherein a threshold voltage of a transistor for discharging the voltage to a triple p-well having applied the first to third voltages to adjust the compare voltage;

a comparator for comparing the reference voltage and the compare voltage to generate the third signal; and a discharging means for discharging a potential of the output terminal depending on the third signal to discharge the pumping voltage to a target voltage.

12. The circuit according to claim 11, wherein the discharging means includes:

a switching means connected to the output terminal and switched depending on an output signal of the comparator; and a current source connected to the switching means and a ground terminal, for generating current to the ground terminal to discharge the potential of the output terminal.

13. The circuit according to claim 11, wherein the control signal generating means includes:

a first NAND gate for receiving the first and second signals as an input;

a first inverter for inverting an output signal of the first NAND gate;

a first delay means for delaying an output signal of the first inverter;

a first NOR gate for receiving the output signal of said first inverter and an output signal of the first delay means as an input;

a second NAND gate for receiving the first and third signals;

a second inverter for inverting an output signal of said second NAND gate;

a second delay means for delaying an output signal of the second inverter;

a second NOR gate for receiving the output signal of the second inverter and an output of the second delay means as an input;

a third NAND gate for receiving output signals of the first and second NOR gates as an input to generate the first control signal; and a third inverter for inverting an output signal of said third NAND gate to generate the fourth control signal.

14. The circuit according to claim 11, wherein the sub-clamping control means includes:

a first transistor drain and gate terminal connected to the output terminal, for discharging the pumping voltage to generate the first voltage;

a second transistor drain and gate terminal connected to a source terminal of the first transistor for discharging the first transistor to generate the second voltage;

a third transistor drain and gate terminal connected to a source terminal of the second transistor for discharging the second voltage to generate the third voltage;

a fourth transistor connected between the third transistor and a ground terminal;

a first transfer gate for connecting the drain and gate terminal of the fourth transistor depending on the first and second control signals; and a fifth transistor for connecting the gate terminal of the fourth transistor and the ground terminal.

15. The circuit according to claim 14, wherein the first to fourth transistors include a triple nMOS transistor, wherein triple p-wells of the first to third transistors are connected to the ground terminal, triple n-wells of the first to third transistors are connected to the drain terminal, and a triple n-well of the fourth transistor is supplied with a power supply voltage.

16. The circuit according to claim 14, wherein a threshold voltage of the first to third transistor is lower than a threshold voltage of the fourth transistor.

17. The circuit according to claim 11, wherein the main clamping control means includes:

sixth to eighth transistors serially connected to the output terminal, gate terminals and triple n-wells connected to drain terminals and to each of triple p-wells supplied with the first to third voltages to discharge the pumping voltage;

a ninth transistor connected between the eighth transistor and the ground terminal, to a triple n-well having applied the power supply voltage and a triple p-well connected to the ground terminal;

a second transfer gate for connecting the drain and gate terminals of the ninth transistor depending on the first and second control signals, for transferring the voltage discharged by the sixth to eighth transistors to the output terminal as a compare voltage; and a tenth transistor for connecting the gate terminal of the ninth transistor and the ground terminal depending on the second control signal.

18. The circuit according to claim 11, wherein a threshold voltage of the fifth to eighth transistors is higher than a threshold voltage of the ninth transistor.

* * * * *